United States Patent
Kou et al.

(10) Patent No.: US 8,386,869 B1
(45) Date of Patent: Feb. 26, 2013

(54) AMPLITUDE DEFECT DETECTION AND CORRECTION IN MAGNETIC STORAGE

(75) Inventors: Yu Kou, San Jose, CA (US); Zheng Wu, San Jose, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 749 days.

(21) Appl. No.: 12/456,508

(22) Filed: Jun. 16, 2009

Related U.S. Application Data (60) Provisional application No. 61/132,426, filed on Jun. 17, 2008.

(51) Int. Cl.
*H03M 13/00* (2006.01)
*H03M 13/25* (2006.01)

(52) U.S. Cl. .......... 714/746; 714/740; 714/49; 341/126; 369/47.25

(58) Field of Classification Search .............. 714/49, 714/740, 746; 341/126, 132; 369/47.25
See application file for complete search history.

(56) References Cited

U.S. PATENT DOCUMENTS

| | | | | |
|---|---|---|---|---|
| 5,418,789 A * | 5/1995 | Gersbach et al. | ............. | 714/705 |
| 5,502,698 A * | 3/1996 | Mochizuki | ................. | 369/44.32 |
| 5,509,020 A * | 4/1996 | Iwakiri et al. | ................ | 714/704 |
| 6,513,141 B1 * | 1/2003 | Livingston | .................... | 714/792 |
| 6,690,751 B1 * | 2/2004 | Nikula et al. | ................. | 375/341 |
| 7,061,840 B2 * | 6/2006 | Honda | ........................ | 369/53.15 |
| 7,791,993 B2 * | 9/2010 | Kikugawa et al. | ......... | 369/47.14 |
| 2002/0122480 A1 * | 9/2002 | Abnous et al. | .................. | 375/233 |
| 2003/0141997 A1 * | 7/2003 | Kawabe et al. | ................ | 341/132 |
| 2004/0129784 A1 * | 7/2004 | Iwaguchi et al. | ......... | 235/462.16 |
| 2008/0104486 A1 * | 5/2008 | Kanaoka | ....................... | 714/780 |
| 2008/0276156 A1 | 11/2008 | Gunnam et al. | | |
| 2008/0285549 A1 * | 11/2008 | Behrens et al. | ............... | 370/359 |
| 2008/0301521 A1 | 12/2008 | Gunnam et al. | | |

* cited by examiner

*Primary Examiner* — Joseph Schell
(74) *Attorney, Agent, or Firm* — Van Pelt, Yi & James LLP (57) ABSTRACT

A defect portion in a signal is processed by receiving an input signal. A location of a defect portion within the input signal and an amplitude of the defect portion is determined. An adjusted signal is generated by adjusting the amplitude of the defect portion using the determined location of the defect portion and the determined amplitude of the defect portion. Information associated with the adjusted signal is decoded.

23 Claims, 6 Drawing Sheets

AMPLITUDE DEFECT DETECTION AND CORRECTION IN MAGNETIC STORAGE

CROSS REFERENCE TO OTHER APPLICATIONS

This application claims priority to U.S. Provisional Patent Application No. 61/132,426 entitled DEFECT RECOVERY IN MAGNETIC RECORDING SYSTEM WITH LDPC CODE filed Jun. 17, 2008 which is incorporated herein by reference for all purposes.

BACKGROUND OF THE INVENTION

Amplitude defects are characterized by a drop or reduction in the amplitude or signal level, for example in a signal that is read back from storage (e.g., magnetic storage). One cause of an amplitude defect in magnetic storage applications is an uneven distribution of magnetic media on a storage disk. The signal read back from the part of the disk having a thinner distribution of magnetic media will have a lower signal amplitude than a signal read back from a thicker part of the disk. It would be desirable to develop new techniques for handling amplitude defects.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Figure 1:
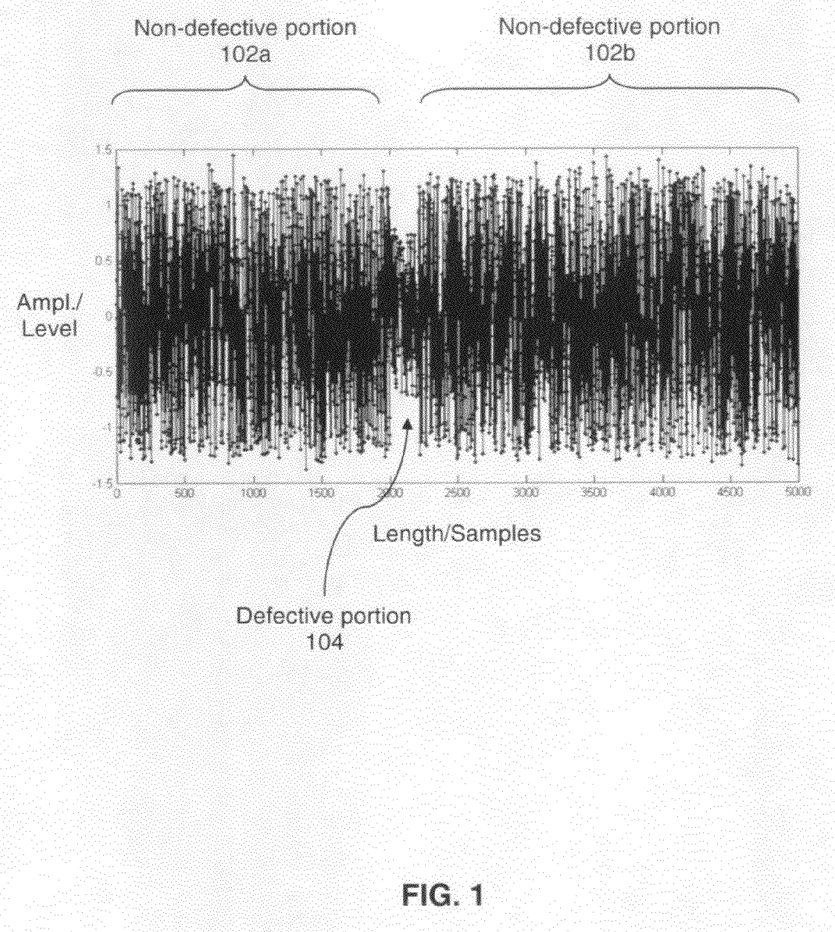
FIG. 1 is a diagram showing an embodiment of a signal containing an amplitude defect.

FIG. 1 is a diagram showing an embodiment of a signal containing an amplitude defect. In the example shown, the x-axis shows a number of samples or a length, and the y-axis shows an amplitude or signal level (e.g., voltage or current). During non-defective portions 102a and 102b, the signal ranges from a maximum level of approximately 1.25 to a minimum level of approximately −1.25. During defective portion 104, the maximum level is approximately 0.75, and the minimum level is approximately −0.75.

What is disclosed herein is a technique that determines the location of a defective portion within a signal (e.g., by determining a starting sample number and an ending sample number of defective portion 104), determines the amplitude of the defective portion, and adjusts the amplitude of the defective portion accordingly based on the determined amplitude. Using the signal shown in FIG. 1 as an example, after adjusting the amplitude of defective portion 104 (not shown), the post-adjustment levels of adjusted portion 104 (not shown) will have a range of approximately (−1.25, 1.25) instead of (−0.75, 0.75) as it was prior to adjustment.

In various embodiments, a signal containing an amplitude defect is obtained or otherwise received from a variety of sources. In some embodiments, the technique is used in a storage environment, and the signal is read back from a storage device, such as a disk drive system. In some embodiments, the technique is used in a (e.g., wireless) communications environment, and the signal is received over a communications channel (e.g., via a wireless medium).

In some embodiments, this technique is triggered in the event a decoder fails. For example, an amplitude defect detector may be part of a read processor in a storage device that also includes a low-density parity-check code (LDPC) decoder. An LDPC code is a type of error correcting code. In some embodiments, amplitude defect detection and adjustment is triggered if there is a decoding failure (e.g., by an LDPC decoder). Some other types of error correcting codes include Reed-Solomon codes and Hamming codes, and in some other embodiments a failure by some other error correcting decoder triggers amplitude defect detection and adjustment to be performed. In some applications, performing defect detection and adjustment only some of the time as opposed to all of the time is desirable since processing resources, power consumption, and/or system latency are conserved.

In some embodiments, an amplitude defect detector is configured to only detect (and thus adjust) defective portions that exceed a certain length and/or a certain change in amplitude. In one example, a potential defective portion must be longer than 100 bits and have an amplitude drop of at least 30% to be declared a defect and adjusted. In some applications, the system uses an error correcting code, and the code is capable of correcting an amplitude defect that is relatively short in length and/or has a relatively mild amplitude drop. In contrast, a relatively long defect length and/or relatively severe drop in amplitude may be more than the error correcting code is capable of handling. A benefit of setting a length threshold and/or an amplitude drop threshold for declaring an amplitude defect is that fewer false positives will occur. Adjusting a portion that is not actually defective introduces noise, and therefore false positives are undesirable.

Although FIG. 1 shows defective portion 104 as having an amplitude drop, in some embodiments a defective portion has an amplitude that is larger than normal or typical. The techniques described herein are applicable to both cases. For example, by scaling back a defective portion having an amplitude that is too large or even saturated, the performance can be improved. Saturation or clipping happens if a large enough signal enters an analog to digital converter (ADC). So in a sense, saturation limits the amplitude a signal can have. That's one of the reasons why a defect with larger signal amplitude is not as harmful as a defect with smaller signal amplitude.

Figure 2:
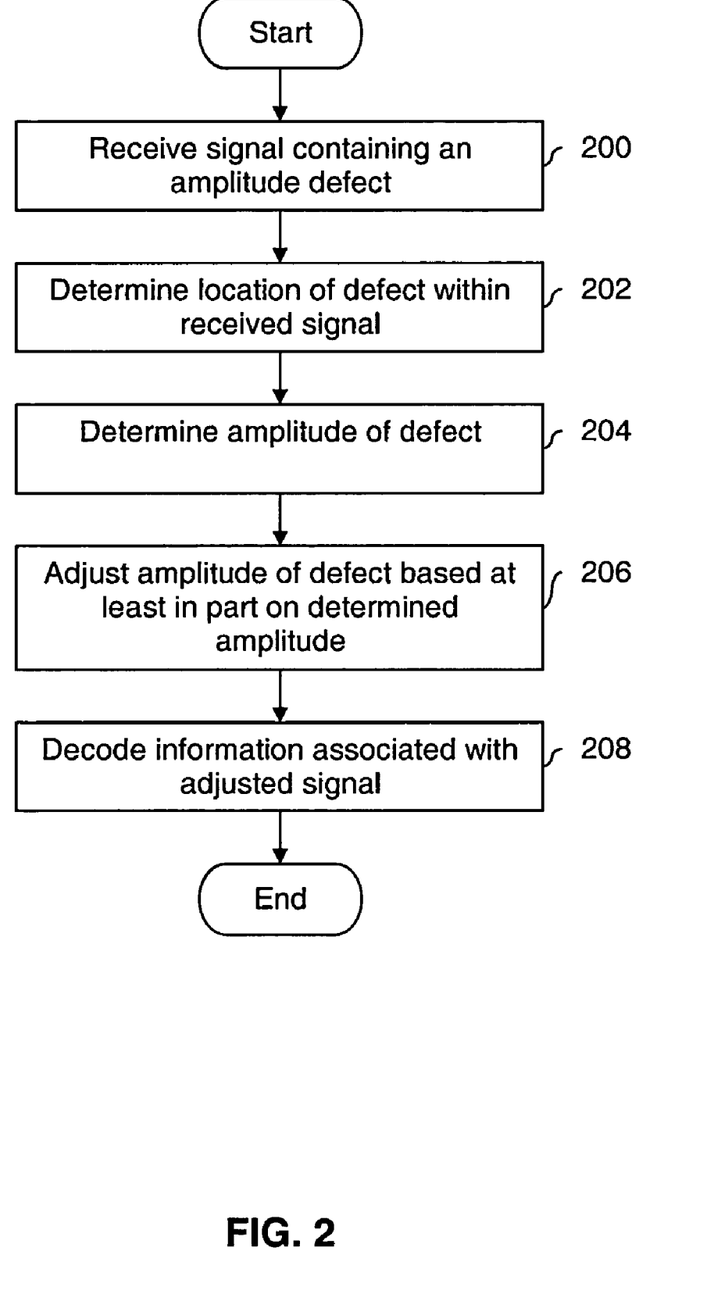
FIG. 2 is a flowchart illustrating an embodiment of a process for detecting and adjusting amplitude defects in a signal.

FIG. 2 is a flowchart illustrating an embodiment of a process for detecting and adjusting amplitude defects in a signal. In some embodiments, the process shown herein is triggered when a detector or decoder fails. At 200, a signal containing an amplitude defect is received. In some embodiments, the received signal is obtained from an analog to digital converter (ADC); that is, in those embodiments the received signal is digitized. In some embodiments, the signal is received from a digital equalizer.

At 202, a location of a defect within a received signal is determined. In some embodiments, step 202 includes using a moving average; and the generated averages, a minimum amplitude drop, and a minimum length are used to detect defects. In one example, the minimum length is 500 samples, and the time constant of the moving average is set in the range of 50-100. In some applications, a moving average is desirable because the amplitude of a signal is data dependent and using a moving average reduces some of the data dependency. In some embodiments, characteristics or statistics about the amplitude defect are known (e.g., from historical information it is known the signal level of a defect region is 70% of normal), and a minimum amplitude drop is set accordingly (e.g., to 85% of normal). In some embodiments, the end of a defect is declared when the moving average of the signal level or amplitude goes above the minimum amplitude drop.

At 204, the amplitude of a defect is determined. In some embodiments, this step is intertwined with determining a defect location at 202. For example, to detect a defect at 202, the amplitude in some embodiments must be known. The amplitude of a defect is adjusted based at least in part on the determined amplitude at 206. In some embodiments, clipping and saturation are undesirable, and the amplitude determined at 204 and used to adjust the defect at 206 is selected to avoid or mitigate clipping or saturation. Information associated with the adjusted signal is decoded at 208. In some embodiments, the adjusted signal is passed directly to a decoder. In some embodiments, some intermediate processing is performed between adjusting and decoding.

In some embodiments, the example process is repeated multiple times, for example each time with a different set of parameters or control signals. For example, the process may be repeated with different minimum amplitude drops, different minimum lengths, and/or different time constants. In some embodiments, after each iteration, decoding (e.g., LDPC decoding) is performed, and if the decoding succeeds, the process stops.

In some embodiments, a single module or block determines the defect length and amplitude drop at 202 and 204 as well as adjustment at 206. In some embodiments, one block or module performs steps 202 and 204, and another block or module performs the adjustment (e.g., when provided the location and amplitude drop). For example, in some systems an analog to digital converter (ADC) or digital equalizer is configured to perform the adjustment at 206.

Figure 3:
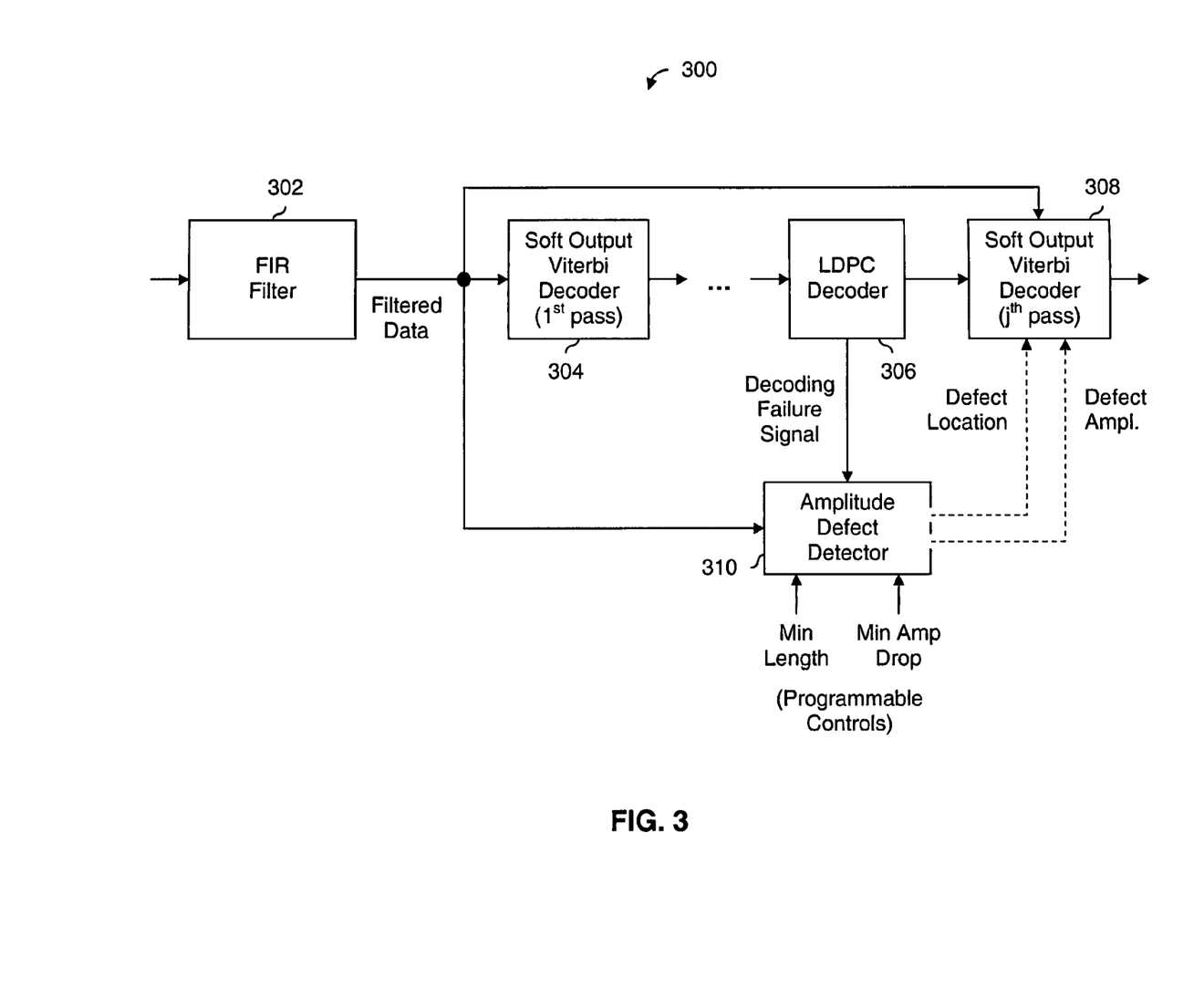
FIG. 3 is a block diagram showing an embodiment of a system configured to detect and adjust amplitude defects.

FIG. 3 is a block diagram showing an embodiment of a system configured to detect and adjust amplitude defects. Referring back to the example process shown in FIG. 2, amplitude defect detector 310 performs steps 202 and 204 (i.e., determines the location and amplitude of a defect), and the jth pass or stage 308 of the soft output Viterbi decoder performs the adjustment at step 206.

System 300 includes finite impulse response (FIR) filter 302, which receives input data and outputs filtered data. In the example shown, FIR filter 302 provides partial channel response. In some embodiments, a filter that provides partial channel response (such as an FIR filter) is used to determine a normal signal level of an input signal. The filtered data is passed from FIR filter 302 to soft output Viterbi decoder stage 304, which performs a first pass or iteration of Viterbi decoding. The output of the Viterbi decoder stage is passed to an LDPC decoder with soft information in and out. Such a Viterbi-LDPC round is called a global iteration. If the LDPC decoding succeeds during any round of global iteration, the whole process will stop.

The defect detector is used at the $j^{th}$ global iteration and after, if the LDPC decoding fails in the past j−1 iterations.

LDPC decoder 306 performs low-density parity-check processing on the data passed to it. In system 300, amplitude defect detector 310 is activated or triggered in the event LDPC decoder 306 fails. In such cases, a decoding failure signal is passed from LDPC decoder 306 to amplitude defect detector 310. In the event LDPC decoder 306 is able to properly decode the data passed to it, amplitude defect detector 310 remains inactive. Under those conditions, the properly decoded data is passed from LDPC decoder 306 to soft output Viterbi decoder stage 308 for a jth iteration or pass of Viterbi decoding, and the Viterbi decoded data is output.

The FIR output for the same codeword is an input to the Viterbi detector, regardless of defect detection. In each global iteration, the Viterbi decoding stage takes the FIR output together with the information from LDPC decoding (except for the first Viterbi detection, where LDPC has no information to give) as the inputs.

In the event the failure signal output by LDPC decoder 306 indicates a failure, amplitude defect detector 310 becomes active. In some other embodiments, another type of decoding besides LDPC is performed, and a failure of that decoder triggers defect detection. Amplitude defect detector 310 receives its input signal from the FIR filter and outputs the location and amplitude of any defective portion it finds in the input signal. In some other embodiments, a defect detector takes the signal before FIR equalization. The defect location and defect amplitude are passed from amplitude defect detector 310 to soft output Viterbi decoder stage 308, which adjusts the defective portion using the provided location and amplitude of the defect. Alternatively, the location and amplitude of the defect are passed to FIR filter 302 to adjust the signal output by FIR filter 302 accordingly. In various embodiments, the amplitude is an amount or percentage drop, is a percentage of normal, is the determined signal level or amplitude (e.g., −0.75 to 0.75 as in FIG. 1), etc.

In some embodiments, Viterbi decoder stages 304 and 308 are implemented as a single, shared block or module, for example to keep die size and manufacturing costs down. In some embodiments, multiple blocks or modules are used to implement Viterbi decoder stages 304 and 308, for example to improve processing time.

In this example, amplitude defect detector 310 receives the following two programmable controls that are used to detect a defective portion in the input signal: minimum length and minimum amplitude drop. These values are programmable and can be adjusted, for example, through signal inputs, register writes, etc. In some embodiments, a moving average is used to detect a defect, and an amplitude defect detector includes an adjustable control that sets the time constant of the moving average.

In some embodiments, system 300 is configured to drop or otherwise erase information if an amplitude drop is too severe. In some embodiments, there are three possible responses or operations performed by a system. If there is no defect detected (e.g., as when processing non-defective portions 102a and 102b in FIG. 1), then no adjustment is made to that portion. If there is a defect with a relatively moderate amplitude drop, then the defective portion is adjusted based on the amount of the drop. If the defect has a significant amplitude drop, the defective portion is removed, abandoned, or erased. In one example, log likelihood ratio (LLR) values corresponding to the defective portion are erased, and an erasure is passed to a downstream decoder that receives these LLR values.

Figure 4A:
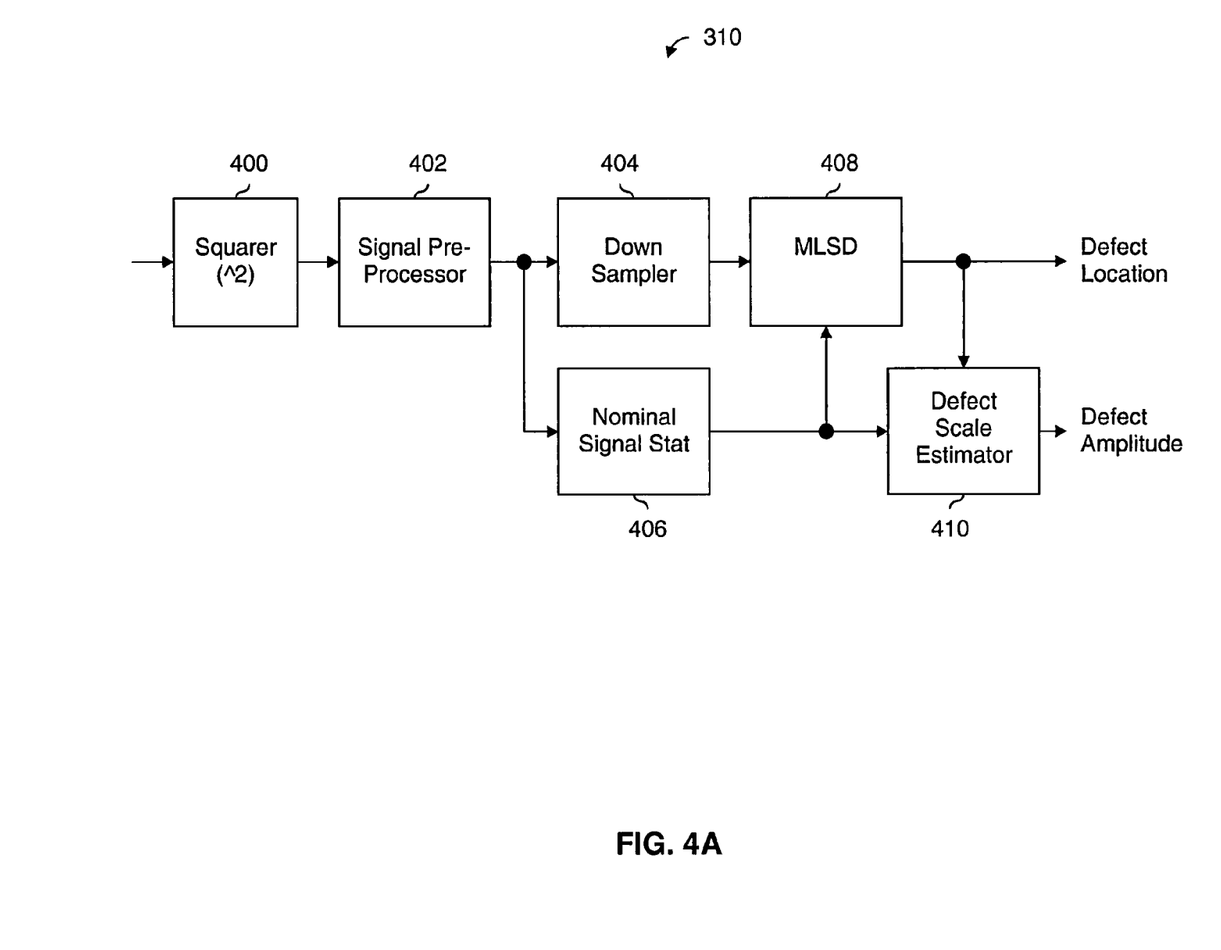
FIG. 4A is a block diagram showing a first embodiment of a defect detector.

FIG. 4A is a block diagram showing a first embodiment of a defect detector. In some embodiments, amplitude defect detector 310 in FIG. 3 is implemented as shown. The amplitude of an input signal is first squared by squarer 400. Squaring the amplitude increases a detection margin between a normal or non-defective portion of a signal and a defective portion. Alternatively, in some other embodiments, squaring is not performed.

The squared signal is passed from squarer 400 to signal pre-processor 402. Signal pre-processor 402 reduces the data-dependency of the input signal and/or removes noise. In a first example of pre-processing, the amplitude of a signal is averaged over a sliding window of length N, outputting average values. For a normal signal, the average amplitudes output are (relatively) steady or fixed, while a defective portion has an average amplitude that varies or in general is not steady. In a second example, a signal is divided into non-overlapping "chunks" of length K; from each chunk, the largest amplitude is selected and used in an average over a sliding window of length N, where N is a multiple of K. By taking the local maximum in windows of length K, the data randomness is reduced, and the detection performance is improved. In a third example, input signal amplitudes in a sliding window of length N are sorted in descending order. The first K samples (i.e., the largest K amplitudes) are selected and averaged.

After pre-processing, the signal is passed to down sampler 404 and nominal signal statistics block 406. Normal signal statistics block 406 receives the sliding window average signal from signal pre-processor 402 and performs adaptation or averaging on the input signal, outputting a steady mean value of the normal pre-processed signal to MLSD 408 and defect scale estimator 410.

Down sampler 404 down samples the signal passed to it and reduces the complexity of the system. For example, by having fewer data samples to process, the system can operate at a slower clock frequency (e.g., in the case of FPGAs, ASICs, or microcontrollers), and complexity is reduced.

Maximum likelihood sequence detection (MLSD) block 408 is configured to receive a down sampled signal from down sampler 404 and the normal mean value from normal signal statistics block 406. MLSD 408 is configured to use a trellis to perform maximum likelihood detection. In one example, the trellis has a normal state and a defective state, and constraints are put on the valid path. In various embodiments, the metric assigned to each branch is a hard decision (e.g., a 0 or 1) or is a soft decision (e.g., a likelihood).

Figure 4B:
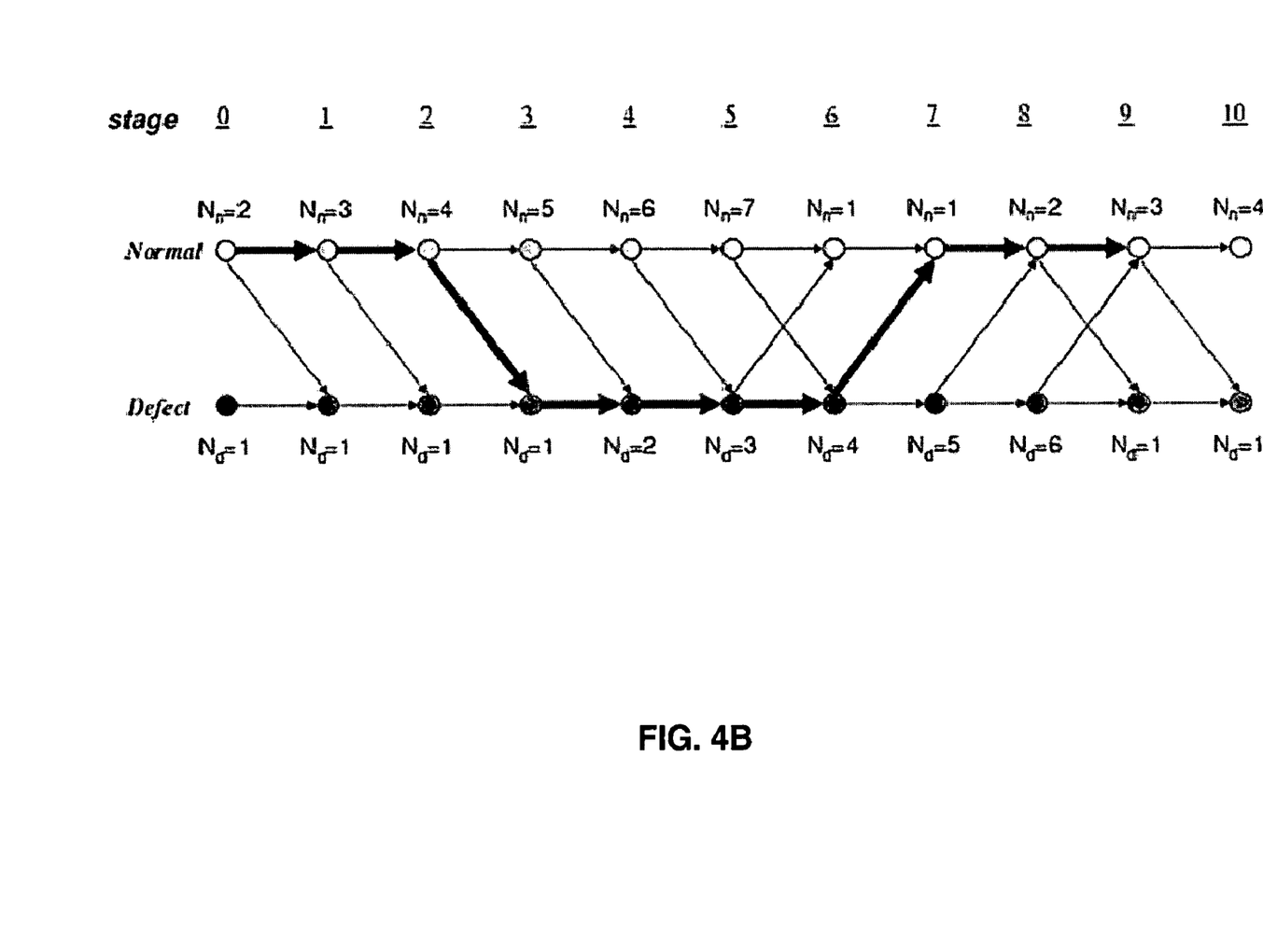
FIG. 4B is a diagram showing an embodiment of a trellis.

FIG. 4B is a diagram showing an embodiment of a trellis. In some embodiments, MLSD 408 in FIG. 408 uses the technique described in this example to perform maximum likelihood detection. In this example, a valid path needs to stay at the defect state at least 3 times before it returns to the normal state, and stay at the normal state at least 2 times before it can go into the defect state again. An accumulator for each state, of how many steps a valid path has stayed in this state is used to justify if a branch back to the other state is allowed. For example, in the figure shown, the accumulator for the normal state is set to 2 and the accumulator for the defect state is set to 1 at the beginning. At this time, the defect state has no branch going to the normal state. The survivor path is the one with a wider line width. It goes to the defect state, and stays there for 4 stages or iterations. When the accumulator for the defect state goes to 3, a branch going to the normal state from the defect state appears (though it is not chosen because the defect has not ended yet). When the survivor path goes back to the normal state, the branch from the normal state to the defect state is erased until the accumulator for the normal state goes to 2.

Returning back to FIG. 4A, a defect location is output by MLSD block 408 and is passed to defect scale estimator 410 which also receives the mean value from nominal signal statistics block 406. Defect scale estimator 410 outputs a suggested amplitude change of the defect portion by dividing the mean value of the normal pre-processed signal by the mean value of the pre-processed signal at the defect. If a squarer is used before the pre-processor, the output scale is the square root of the value from division.

Figure 5:
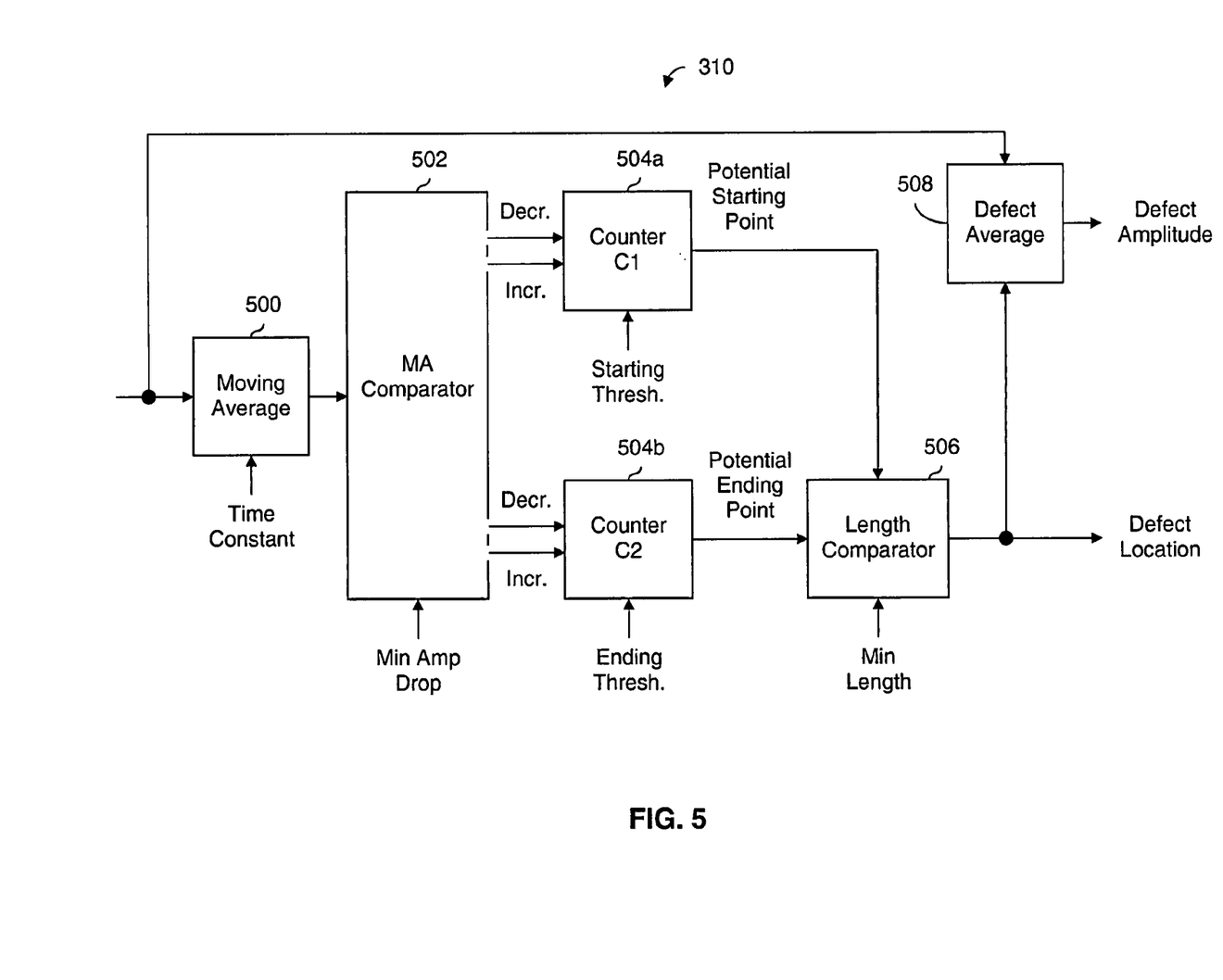
FIG. 5 is a block diagram showing a second embodiment of a defect detector.

FIG. 5 is a block diagram showing a second embodiment of a defect detector. In some embodiments, amplitude defect detector 310 in FIG. 3 is implemented as shown.

An input signal is passed to moving average block 500, which also receives a configurable time constant used in averaging (i.e., how wide of a window the moving average covers). In some embodiments, the time constant is set in the range of 50-100. The averages output by moving average block 500 are passed to moving average (MA) comparator 502, which compares the averages to a minimum amplitude drop. The minimum amplitude drop is programmable in this example and can be adjusted as desired. In one example, the minimum amplitude drop is set to 85% of normal. That is, the average output by moving average block 500 must be between 0 and 85% of normal to trigger MA comparator 502. MA comparator 502 receives a configurable normal amplitude or normal signal level (not shown). MA comparator 502 increments counter C1 (504a) if an average output by moving average block 500 is less than the minimum amplitude drop. Otherwise, the counter C1 is decremented. If counter C1 exceeds a starting threshold, a potential starting point of a defect is declared. In some embodiments, the value of the starting threshold is determined via simulation.

A second counter, C2 (504b), is used to determine potential ending points of a defect. If an average output by moving average block 500 is greater than the minimum amplitude drop, C2 is incremented. Otherwise C2 is decremented. In this example, counter C1 is reset and stopped when a potential starting point is found and restarted when a potential ending point is found. C2 starts when a potential starting point is found and resets and stops after a potential ending point is found. If C2 exceeds an ending threshold, then a potential ending point is output. In some embodiments, the ending threshold and starting threshold are set to the same value.

A potential starting point and potential ending point are passed from counters C1 and C2, respectively, to length comparator 506. Length comparator 506 receives a programmable minimum length which is used to detect a defect. In some embodiments, a defect is declared if (<potential ending point>+offset1−<potential starting point>−offset2)>=minimum length. Otherwise, if it is less than the minimum length, a defect is not declared. In some embodiments, the values for offset1 and/or offset2 come from the sliding window calculation. For example, suppose the amplitude of the FIR output signal drops sharply from sample k, to sample k+1 (i.e., k+1 is the starting point of a defect). However, when performing a sliding window average, say average over k to k+N, the starting point will be between the average of k−N+1 to k, and the average of k+1 to k+N, since the earlier average is over a normal signal, and the later average is totally over the defect signal. When a threshold is set between these two averages, the starting point will be detected between these two, not k−N+1, nor k+1. So there is an offset between the starting point detected and the real starting point.

If a defect is detected, the length and/or location of the defect is output by length comparator 506 and is passed to defect average block 508. Defect average block 508 also receives the input to moving average block 500 (i.e., before averaging), and the amplitude of the samples in the defective portion are averaged.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for processing a signal, comprising:
   a defect detector configured to receive an input signal and to determine a location of a defect portion within the input signal and an amplitude of the defect portion, wherein:
   the defect detector is configured to determine the location of the defect portion within the input signal by performing maximum likelihood sequence detection (MLSD) using a trellis;
   the trellis includes a defect state that is associated with a sample in the input signal being defective and a normal state that is associated with a sample in the input signal being normal; and
   the defect detector is configured to determine the location of the defect portion within the input signal by permitting a transition from the defective state to the normal state only if the defective state has been consecutively occupied more than a specified number of times;
   a signal hardware processor configured to generate an adjusted signal by adjusting the amplitude of the defect portion using the determined location of the defect portion and the determined amplitude of the defect portion, wherein the signal processor is configured to perform the adjustment prior to error correction decoding; and
   an error correction decoder configured to perform error correction decoding on the adjusted signal.

2. The system recited in claim 1, wherein the defect detector is configured to determine the location of the defect portion using one or more of the following: a minimum defect length or a minimum amplitude drop.

3. The system recited in claim 1, wherein the defect detector and the signal processor are configured to operate in the event error correction decoding fails.

4. The system recited in claim 1, wherein the error correction decoder includes at least one of the following: a Reed-Solomon decoder or a low-density parity-check code (LDPC) decoder.

5. The system recited in claim 1, wherein the defect detector is configured to perform one or more of the following: a moving average, a squaring function, or down sampling.

6. A method for processing a signal, comprising:
   receiving an input signal at a processor;
   determine a location of a defect portion within the input signal and an amplitude of the defect portion using the processor, wherein:
   determining the location of the defect portion within the input signal includes performing maximum likelihood sequence detection (MLSD) using a trellis;
   the trellis includes a defect state that is associated with a sample in the input signal being defective and a normal state that is associated with a sample in the input signal being normal; and
   determining the location of the defect portion within the input signal includes permitting a transition from the defective state to the normal state only if the defective state has been consecutively occupied more than a specified number of times;
   generating an adjusted signal, using the processor, by adjusting the amplitude of the defect portion using the determined location of the defect portion and the determined amplitude of the defect portion, wherein the adjustment occurs prior to error correction decoding; and
   performing error correction decoding on the adjusted signal using the processor.

7. The method recited in claim 6, wherein determining the location of the defect portion includes using one or more of the following: a minimum defect length or a minimum amplitude drop.

8. The method recited in claim 6, wherein the steps of determining the location of the defect portion and the amplitude of the defect portion and generating the adjusted signal are performed in the event error correction decoding fails.

9. The method recited in claim 6, wherein decoding information associated with the adjusted signal includes using at least one of the following: a Reed-Solomon code or a low-density parity-check code (LDPC) code.

10. The method recited in claim 6, wherein determining the location of the defect portion and/or the amplitude of the defect portion includes performing one or more of the following: a moving average, a squaring function, or down sampling.

11. A computer program product for processing a signal, the computer program product being embodied in a non-transitory computer readable storage medium and comprising computer instructions for:
    receiving an input signal at a processor;
    determine a location of a defect portion within the input signal and an amplitude of the defect portion using the processor, wherein:
    the computer instructions for determining the location of the defect portion within the input signal include computer instructions for performing maximum likelihood sequence detection (MLSD) using a trellis;
    the trellis includes a defect state that is associated with a sample in the input signal being defective and a normal state that is associated with a sample in the input signal being normal; and
    the computer instructions for determining the location of the defect portion within the input signal include computer instructions for permitting a transition from the defective state to the normal state only if the defective state has been consecutively occupied more than a specified number of times;

generating an adjusted signal, using the processor, by adjusting the amplitude of the defect portion using the determined location of the defect portion and the determined amplitude of the defect portion, wherein the adjustment occurs prior to error correction decoding; and performing error correction decoding on the adjusted signal using the processor.

12. A system for processing a signal, comprising:
a defect detector configured to receive an input signal and to determine a location of a defect portion within the input signal and an amplitude of the defect portion, wherein:
  the defect detector is configured to determine the location of the defect portion within the input signal by performing maximum likelihood sequence detection (MLSD) using a trellis;
  the trellis includes a defect state that is associated with a sample in the input signal being defective and a normal state that is associated with a sample in the input signal being normal; and
  the defect detector is configured to determine the location of the defect portion within the input signal by permitting a transition from the normal state to the defective state only if the normal state has been consecutively occupied more than a specified number of times;
a signal hardware processor configured to generate an adjusted signal by adjusting the amplitude of the defect portion using the determined location of the defect portion and the determined amplitude of the defect portion, wherein the signal processor is configured to perform the adjustment prior to error correction decoding; and
an error correction decoder configured to perform error correction decoding on the adjusted signal.

13. The system recited in claim 12, wherein the defect detector and the signal processor are configured to operate in the event error correction decoding fails.

14. The system recited in claim 12, wherein the error correction decoder includes at least one of the following: a Reed-Solomon decoder or a low-density parity-check code (LDPC) decoder.

15. A method for processing a signal, comprising:
receiving an input signal at a processor;
determine a location of a defect portion within the input signal and an amplitude of the defect portion using the processor, wherein:
  determining the location of the defect portion within the input signal includes performing maximum likelihood sequence detection (MLSD) using a trellis;
  the trellis includes a defect state that is associated with a sample in the input signal being defective and a normal state that is associated with a sample in the input signal being normal; and
  determining the location of the defect portion within the input signal includes permitting a transition from the normal state to the defective state only if the normal state has been consecutively occupied more than a specified number of times;
generating an adjusted signal, using the processor, by adjusting the amplitude of the defect portion using the determined location of the defect portion and the determined amplitude of the defect portion, wherein the adjustment occurs prior to error correction decoding; and
performing error correction decoding on the adjusted signal using the processor.

16. The method recited in claim 15, wherein the steps of determining the location of the defect portion and the amplitude of the defect portion and generating the adjusted signal are performed in the event error correction decoding fails.

17. A computer program product for processing a signal, the computer program product being embodied in a non-transitory computer readable storage medium and comprising computer instructions for:
receiving an input signal at a processor;
determine a location of a defect portion within the input signal and an amplitude of the defect portion using the processor, wherein:
  the computer instructions for determining the location of the defect portion within the input signal include computer instructions for performing maximum likelihood sequence detection (MLSD) using a trellis;
  the trellis includes a defect state that is associated with a sample in the input signal being defective and a normal state that is associated with a sample in the input signal being normal; and
  the computer instructions for determining the location of the defect portion within the input signal include computer instructions for permitting a transition from the normal state to the defective state only if the normal state has been consecutively occupied more than a specified number of times.

18. A system for processing a signal, comprising:
a defect detector configured to receive an input signal and to determine a location of a defect portion within the input signal and an amplitude of the defect portion;
a signal hardware processor configured to generate an adjusted signal by adjusting the amplitude of the defect portion using the determined location of the defect portion and the determined amplitude of the defect portion, wherein the signal processor is configured to perform the adjustment prior to error correction decoding; and
an error correction decoder configured to perform error correction decoding on the adjusted signal, wherein:
  the adjusted signal is associated with a first minimum defect length and a first minimum amplitude drop; and
  in the event the error correction decoder fails when operating on the adjusted signal associated with the first minimum defect length and the first minimum amplitude drop, the defect detector is further configured to determine the location of the defect portion and the amplitude of the defect portion using one or more of the following: a second minimum defect length different from the first minimum defect length or a second minimum amplitude drop different from the first minimum amplitude drop.

19. The system recited in claim 18, wherein the defect detector and the signal processor are configured to operate in the event error correction decoding fails.

20. The system recited in claim 18, wherein the error correction decoder includes at least one of the following: a Reed-Solomon decoder or a low-density parity-check code (LDPC) decoder.

21. A method for processing a signal, comprising:
receiving an input signal at a processor;

determine a location of a defect portion within the input signal and an amplitude of the defect portion using the processor;

generating an adjusted signal, using the processor, by adjusting the amplitude of the defect portion using the determined location of the defect portion and the determined amplitude of the defect portion, wherein the adjustment occurs prior to error correction decoding; and performing error correction decoding on the adjusted signal using the processor, wherein:

the adjusted signal is associated with a first minimum defect length and a first minimum amplitude drop; and the method further includes: in the event error correction decoding fails when operating on the adjusted signal associated with the first minimum defect length and the first minimum amplitude drop, determining the location of the defect portion and the amplitude of the defect portion using one or more of the following: a second minimum defect length different from the first minimum defect length or a second minimum amplitude drop different from the first minimum amplitude drop.

22. The method recited in claim 21, wherein the steps of determining the location of the defect portion and the amplitude of the defect portion and generating the adjusted signal are performed in the event error correction decoding fails.

23. A computer program product for processing a signal, the computer program product being embodied in a non-transitory computer readable storage medium and comprising computer instructions for:

receiving an input signal at a processor;

determine a location of a defect portion within the input signal and an amplitude of the defect portion using the processor;

generating an adjusted signal, using the processor, by adjusting the amplitude of the defect portion using the determined location of the defect portion and the determined amplitude of the defect portion, wherein the adjustment occurs prior to error correction decoding; and performing error correction decoding on the adjusted signal using the processor, wherein:

the adjusted signal is associated with a first minimum defect length and a first minimum amplitude drop; and the computer program product further comprises computer instructions for: in the event error correction decoding fails when operating on the adjusted signal associated with the first minimum defect length and the first minimum amplitude drop, determining the location of the defect portion and the amplitude of the defect portion using one or more of the following: a second minimum defect length different from the first minimum defect length or a second minimum amplitude drop different from the first minimum amplitude drop.

* * * * *